(12) United States Patent
Garcia

(10) Patent No.: US 12,506,462 B2
(45) Date of Patent: *Dec. 23, 2025

(54) TRANSVERSELY-EXCITED FILM BULK ACOUSTIC RESONATOR WITH MULTI-PITCH INTERDIGITAL TRANSDUCER

(71) Applicant: Murata Manufacturing Co., Ltd.

(72) Inventor: Bryant Garcia, Burlingame, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 268 days.

This patent is subject to a terminal disclaimer.

(21) Appl. No.: 17/093,239

(22) Filed: Nov. 9, 2020

(65) Prior Publication Data

US 2021/0273629 A1 Sep. 2, 2021

Related U.S. Application Data

(60) Provisional application No. 62/983,400, filed on Feb. 28, 2020.

(51) Int. Cl.
  *H03H 9/13* (2006.01)
  *H03H 9/02* (2006.01)
  *H03H 9/17* (2006.01)
  *H03H 9/56* (2006.01)

(52) U.S. Cl.
  CPC ........ *H03H 9/132* (2013.01); *H03H 9/02228* (2013.01); *H03H 9/174* (2013.01); *H03H 9/564* (2013.01); *H03H 9/568* (2013.01)

(58) Field of Classification Search
  CPC .................................. H03H 9/25; H03H 9/64
  See application file for complete search history.

(56) References Cited

U.S. PATENT DOCUMENTS

| 5,631,515 A | 5/1997 | Mineyoshi et al. |
| 6,540,827 B1 | 4/2003 | Evy et al. |
| 6,570,470 B2 | 5/2003 | Maehara et al. |
| 6,946,932 B2 * | 9/2005 | Takagi ..................... H03H 9/25 333/195 |

(Continued)

FOREIGN PATENT DOCUMENTS

| CN | 106788318 A | 5/2017 |
| CN | 110417373 A | 11/2019 |

(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

(Continued)

*Primary Examiner* — Andrea Lindgren Baltzell
*Assistant Examiner* — Alan Wong
(74) *Attorney, Agent, or Firm* — ArentFox Schiff LLP

(57) ABSTRACT

There are disclosed acoustic resonators. An acoustic resonator includes a single-crystal piezoelectric plate having front and back surfaces, the back surface attached to a surface of a substrate except for a portion of the piezoelectric plate forming a diaphragm spanning a cavity in the substrate. A conductor pattern on the front surface includes a multi-pitch interdigital transducer (IDT) with interleaved fingers of the IDT disposed on the diaphragm.

20 Claims, 9 Drawing Sheets

(56) References Cited

U.S. PATENT DOCUMENTS

| | | | |
|---|---|---|---|
| 7,042,132 B2* | 5/2006 | Bauer | H03H 9/14555 |
| | | | 333/195 |
| 7,463,118 B2 | 12/2008 | Jacobsen | |
| 7,535,152 B2 | 5/2009 | Ogami et al. | |
| 7,679,474 B2* | 3/2010 | Igaki | H03H 9/6483 |
| | | | 333/195 |
| 7,684,109 B2 | 3/2010 | Godshalk et al. | |
| 7,868,519 B2 | 1/2011 | Umeda | |
| 7,965,015 B2* | 6/2011 | Tai | H03H 9/02574 |
| | | | 310/313 R |
| 8,278,802 B1 | 10/2012 | Lee et al. | |
| 8,829,766 B2 | 9/2014 | Milyutin et al. | |
| 8,932,686 B2 | 1/2015 | Hayakawa et al. | |
| 9,219,466 B2 | 12/2015 | Meltaus et al. | |
| 9,240,768 B2 | 1/2016 | Nishihara et al. | |
| 9,276,557 B1 | 3/2016 | Nordquist et al. | |
| 9,369,105 B1 | 6/2016 | Li | |
| 9,425,765 B2 | 8/2016 | Rinaldi | |
| 9,525,398 B1 | 12/2016 | Olsson | |
| 9,564,873 B2* | 2/2017 | Kadota | H03H 9/02015 |
| 9,780,759 B2 | 10/2017 | Kimura et al. | |
| 10,389,391 B2* | 8/2019 | Ito | H03H 9/02685 |
| 10,491,192 B1 | 11/2019 | Piesski | |
| 10,601,392 B2 | 3/2020 | Plesski et al. | |
| 10,637,438 B2 | 4/2020 | Garcia et al. | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,819,319 B1 | 10/2020 | Hyde | |
| 10,868,510 B2 | 12/2020 | Yantchev | |
| 10,958,247 B2* | 3/2021 | Kanazawa | H03H 9/14582 |
| 11,206,009 B2* | 12/2021 | Yantchev | H03H 9/14582 |
| 11,323,089 B2 | 5/2022 | Turner | |
| 11,418,167 B2* | 8/2022 | Garcia | H03H 9/174 |
| 11,437,976 B2* | 9/2022 | Kaneda | H03H 9/02228 |
| 12,088,281 B2* | 9/2024 | Dyer | H03H 9/17 |
| 2002/0158714 A1 | 10/2002 | Kaitila et al. | |
| 2004/0041496 A1 | 3/2004 | Imai et al. | |
| 2004/0207033 A1 | 10/2004 | Koshido | |
| 2004/0207485 A1 | 10/2004 | Kawachi et al. | |
| 2004/0261250 A1 | 12/2004 | Kadota et al. | |
| 2005/0099091 A1 | 5/2005 | Mishima | |
| 2006/0131731 A1 | 6/2006 | Sato | |
| 2006/0152107 A1 | 7/2006 | Tanaka | |
| 2007/0188047 A1 | 8/2007 | Tanaka | |
| 2009/0108960 A1* | 4/2009 | Igaki | H03H 9/6483 |
| | | | 333/195 |
| 2009/0315640 A1 | 12/2009 | Umeda | |
| 2010/0064492 A1 | 3/2010 | Tanaka | |
| 2010/0223999 A1 | 9/2010 | Onoe | |
| 2010/0301703 A1 | 12/2010 | Chen et al. | |
| 2011/0109196 A1 | 5/2011 | Goto | |
| 2011/0199163 A1 | 8/2011 | Yamanaka | |
| 2013/0057360 A1 | 3/2013 | Meltaus et al. | |
| 2013/0234805 A1 | 9/2013 | Takahashi | |
| 2014/0009247 A1 | 1/2014 | Moriya | |
| 2014/0145556 A1 | 5/2014 | Kadota | |
| 2014/0151151 A1 | 6/2014 | Reinhardt | |
| 2014/0152145 A1 | 6/2014 | Kando | |
| 2015/0319537 A1 | 11/2015 | Perois et al. | |
| 2015/0333730 A1 | 11/2015 | Meltaus | |
| 2016/0049920 A1 | 2/2016 | Kishino | |
| 2016/0149554 A1 | 5/2016 | Nakagawa | |
| 2016/0182009 A1 | 6/2016 | Bhattacharjee | |
| 2017/0063332 A1 | 3/2017 | Gilbert et al. | |
| 2017/0104470 A1 | 4/2017 | Koelle et al. | |
| 2017/0179928 A1 | 6/2017 | Raihn et al. | |
| 2017/0187352 A1 | 6/2017 | Omura | |
| 2017/0214387 A1 | 7/2017 | Burak et al. | |
| 2017/0222622 A1 | 8/2017 | Solal et al. | |
| 2017/0264266 A1 | 9/2017 | Kishimoto | |
| 2017/0290160 A1 | 10/2017 | Takano et al. | |
| 2018/0123016 A1 | 5/2018 | Gong et al. | |
| 2018/0316333 A1 | 11/2018 | Nakamura et al. | |
| 2019/0068155 A1 | 2/2019 | Kimura | |
| 2019/0068164 A1 | 2/2019 | Houlden et al. | |
| 2019/0131953 A1 | 5/2019 | Gong | |
| 2019/0181825 A1 | 6/2019 | Schmalzl et al. | |
| 2019/0207583 A1 | 7/2019 | Miura et al. | |
| 2019/0273480 A1 | 9/2019 | Lin | |
| 2019/0305746 A1 | 10/2019 | Ota | |
| 2019/0386633 A1 | 12/2019 | Plesski | |
| 2019/0386635 A1 | 12/2019 | Plesseki | |
| 2020/0007110 A1 | 1/2020 | Konaka et al. | |
| 2020/0244247 A1 | 7/2020 | Maeda | |
| 2020/0304091 A1 | 9/2020 | Yantchev | |
| 2022/0103160 A1 | 3/2022 | Jachowski et al. | |
| 2022/0200567 A1 | 6/2022 | Garcia | |

FOREIGN PATENT DOCUMENTS

| | | |
|---|---|---|
| CN | 210431367 U | 4/2020 |
| JP | H10209804 A | 8/1998 |
| JP | 2001244785 A | 9/2001 |
| JP | 2003078389 A | 3/2003 |
| JP | 2004096677 A | 3/2004 |
| JP | 2004129222 A | 4/2004 |
| JP | 2004304622 A | 10/2004 |
| JP | 2006173557 A | 6/2006 |
| JP | 2007251910 A | 9/2007 |
| JP | 2010103803 A | 5/2010 |
| JP | 2010233210 A | 10/2010 |
| JP | 2013528996 A | 7/2013 |
| JP | 2015054986 A | 3/2015 |
| JP | 2016001923 A | 1/2016 |
| JP | 2018166259 A | 10/2018 |
| JP | 2018207144 A | 12/2018 |
| JP | 2020113939 A | 7/2020 |
| WO | 2010047114 A1 | 4/2010 |
| WO | 2015098694 A1 | 7/2015 |
| WO | 2016017104 | 2/2016 |
| WO | 2016052129 A1 | 4/2016 |
| WO | 2016147687 A1 | 9/2016 |
| WO | 2018003273 A1 | 1/2018 |
| WO | 2018163860 A1 | 9/2018 |
| WO | 2019/111664 A1 | 6/2019 |
| WO | 2020092414 A2 | 5/2020 |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.

(56) References Cited

OTHER PUBLICATIONS

Naumenko et al., "Optimal orientations of Lithium Niobate for resonator SAW filters", 2003 IEEE Ultrasonics Symposium—pp. 2110-2113. (Year: 2003).
USPTO/ISA, International Search Report and Written Opinion for PCT Application No. PCT/US2020/45654 dated Oct. 29, 2020.
Gorisse et al., "Lateral Field Excitation of membrane-based Aluminum Nitride resonators," Joint Conference of the IEEE International Frequency Control and the European Frequency and Time Forum (FCS), May 2011, 5 pages.
Pang et al., "Self-Aligned Lateral Field Excitation Film Acoustic Resonator with Very Large Electromechanical Coupling," IEEE International Ultrasonics, Ferroelectrics, and Frequency Control Joint 50th Anniversary Conference, Aug. 2004, pp. 558-561.
Yandrapalli et al., "Toward Band n78 Shear Bulk Acoustic Resonators Using Crystalline Y-Cut Lithium Niobate Films With Spurious Suppression," Journal of Microelectromechanical System, Aug. 2023, vol. 32, No. 4, pp. 327-334.

\* cited by examiner

TRANSVERSELY-EXCITED FILM BULK ACOUSTIC RESONATOR WITH MULTI-PITCH INTERDIGITAL TRANSDUCER

RELATED APPLICATION INFORMATION

This patent claims priority from provisional patent application 62/983,400, filed Feb. 28, 2020, entitled VARIABLE PITCH XBAR FOR SPURIOUS SUPPRESSION, which is incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to bandpass filters with high power capability for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is less than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size, and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHZ.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
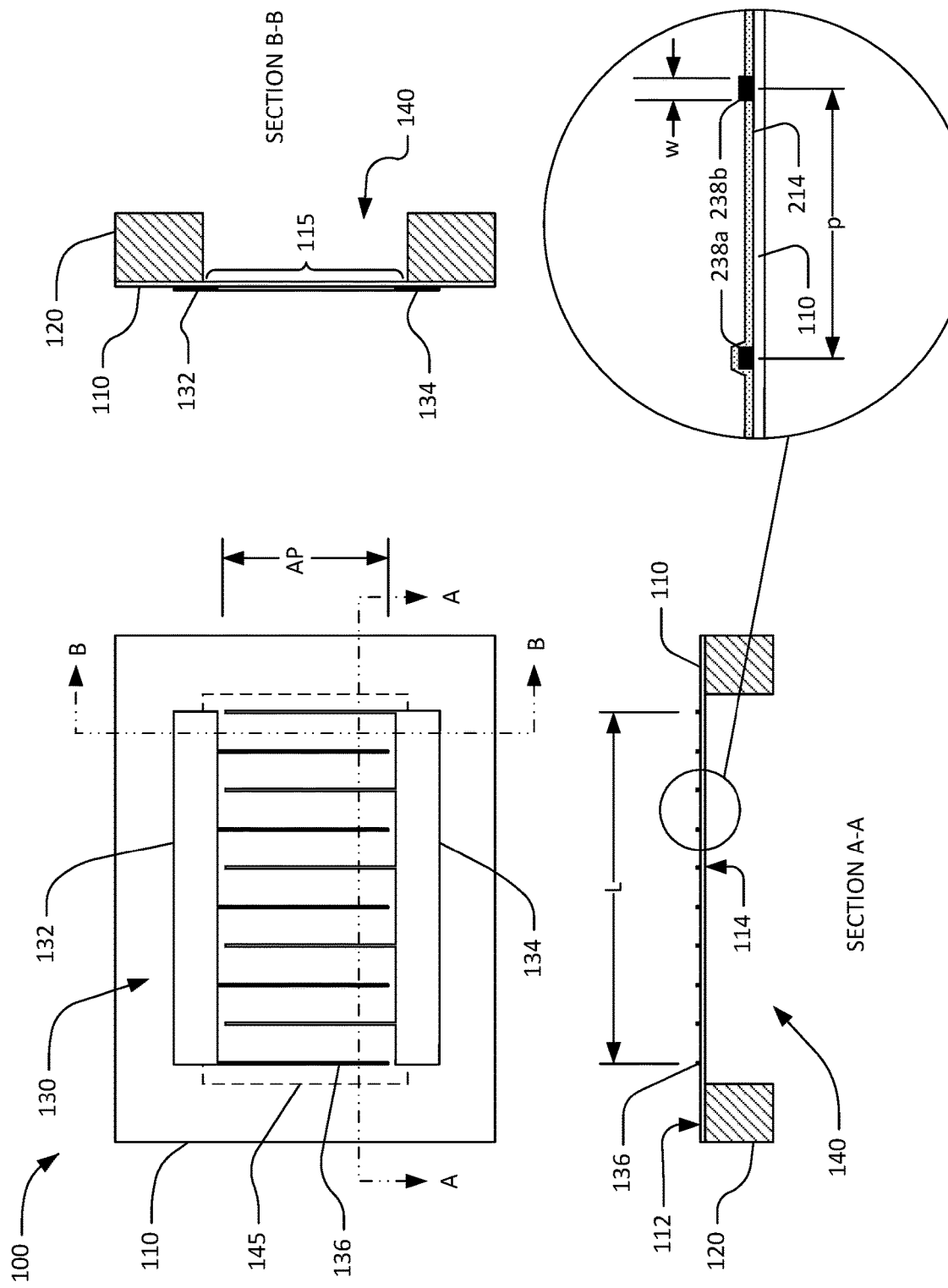
FIG. 1 includes a schematic plan view and two schematic cross-sectional views of a transversely-excited film bulk acoustic resonator (XBAR).

FIG. 1 shows a simplified schematic top view, orthogonal cross-sectional views, and a detailed cross-sectional view of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front and back surfaces 112, 114. However, XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate which spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds of parallel fingers in the IDT 110. Similarly, the thickness of the fingers in the cross-sectional views is greatly exaggerated.

Referring to the detailed cross-sectional view, a front-side dielectric layer 150 may optionally be formed on the front side of the piezoelectric plate 110. The "front side" of the XBAR is, by definition, the surface facing away from the substrate. The front-side dielectric layer 150 may be formed only between the IDT fingers (e.g. IDT finger 138b) or may be deposited as a blanket layer such that the dielectric layer is formed both between and over the IDT fingers (e.g. IDT finger 138a). The front-side dielectric layer 150 may be a non-piezoelectric dielectric material, such as silicon dioxide or silicon nitride. The thickness of the front side dielectric layer is typically less than or equal to the thickness of the piezoelectric plate. The front-side dielectric layer 150 may be formed of multiple layers of two or more materials.

The IDT fingers 138a and 138b may be aluminum, an aluminum alloy, copper, a copper alloy, beryllium, gold, tungsten, molybdenum or some other conductive material.

The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers.

Figure 2:
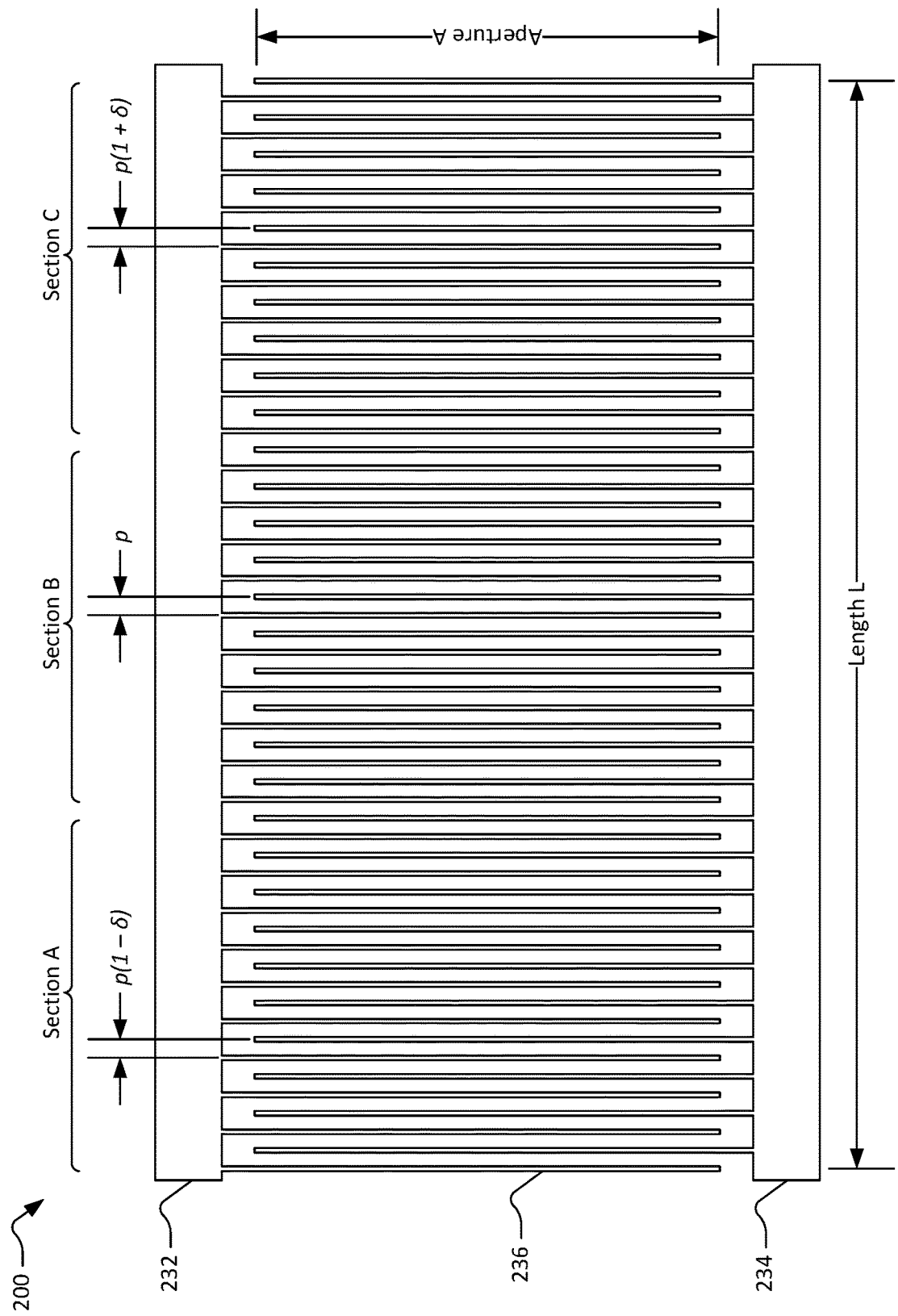
FIG. 2 is a plan view of a multi-pitch IDT.

FIG. 2 is a plan view of an exemplary multi-pitch IDT 200. A "multi-pitch IDT" is an IDT where the pitch between the IDT fingers varies along the length of the IDT. At any given point along the length, the pitch does not vary across the aperture of the IDT. Further, the mark, or finger width, of a multi-pitch IDT is typically constant over the entire IDT. The multi-pitch IDT 200 may be a portion of an XBAR such as the XBAR 100 of FIG. 1.

The multi-pitch IDT 200 includes a first busbar 232, and a second busbar 234, and a plurality of interleaved fingers such as finger 236. The interleaved fingers extend alternately from the first and second busbars 232, 234. The multi-pitch IDT 200 is divided into three sections, identified as Section A, Section B, and Section C, along the length L of the IDT. Each of Sections A, B, and C includes 20 fingers, for a total of 60 fingers in the multi-pitch IDT 200. The use of three sections and 60 fingers is exemplary. An IDT may have more than or fewer than 60 total fingers. An IDT may be divided along its length into two or more sections, each of which includes a plurality of adjacent fingers. The total number of fingers may be divided essentially equally between the two or more sections. In this context, "essentially" means "as close as possible." For example, an IDT with 100 fingers divided into three sections with 33, 34, and 33 fingers is considered to be divided essentially equally. The total number of fingers may be divided unequally between the two or more sections.

In this example, Section B has pitch p, which is the nominal pitch of the IDT. Section A has a pitch of $p(1-\delta)$, and Section C has a pitch of $p(1+\delta)$. $\delta$ is greater than 0 and less than or equal to 0.05. $\delta$ may typically be less than 0.01. $\delta$ may be selected during a filter design to achieve the most effective reduction of spurious modes. At any point along the length L of the IDT 200, the pitch is constant across the aperture A. The mark, or width of the IDT fingers is constant and the same in all sections. When an IDT is divided into two sections or more than three sections, the maximum pitch may be $p(1+\delta)$ and the minimum pitch may be $p(1-\delta)$.

In the example multi-pitch IDT 200, the pitch increases monotonically from left (as seen in the figure) to right. This is not necessarily the case in all multi-pitch IDTs. The sections of a multi-pitch IDT may be arranged in some other order. Further, in the multi-pitch IDT 200, the change in pitch between adjacent sections is constant. This is also not necessarily the case in all multi-pitch IDTs. The change in pitch between adjacent sections may be the same or different.

Figure 3:
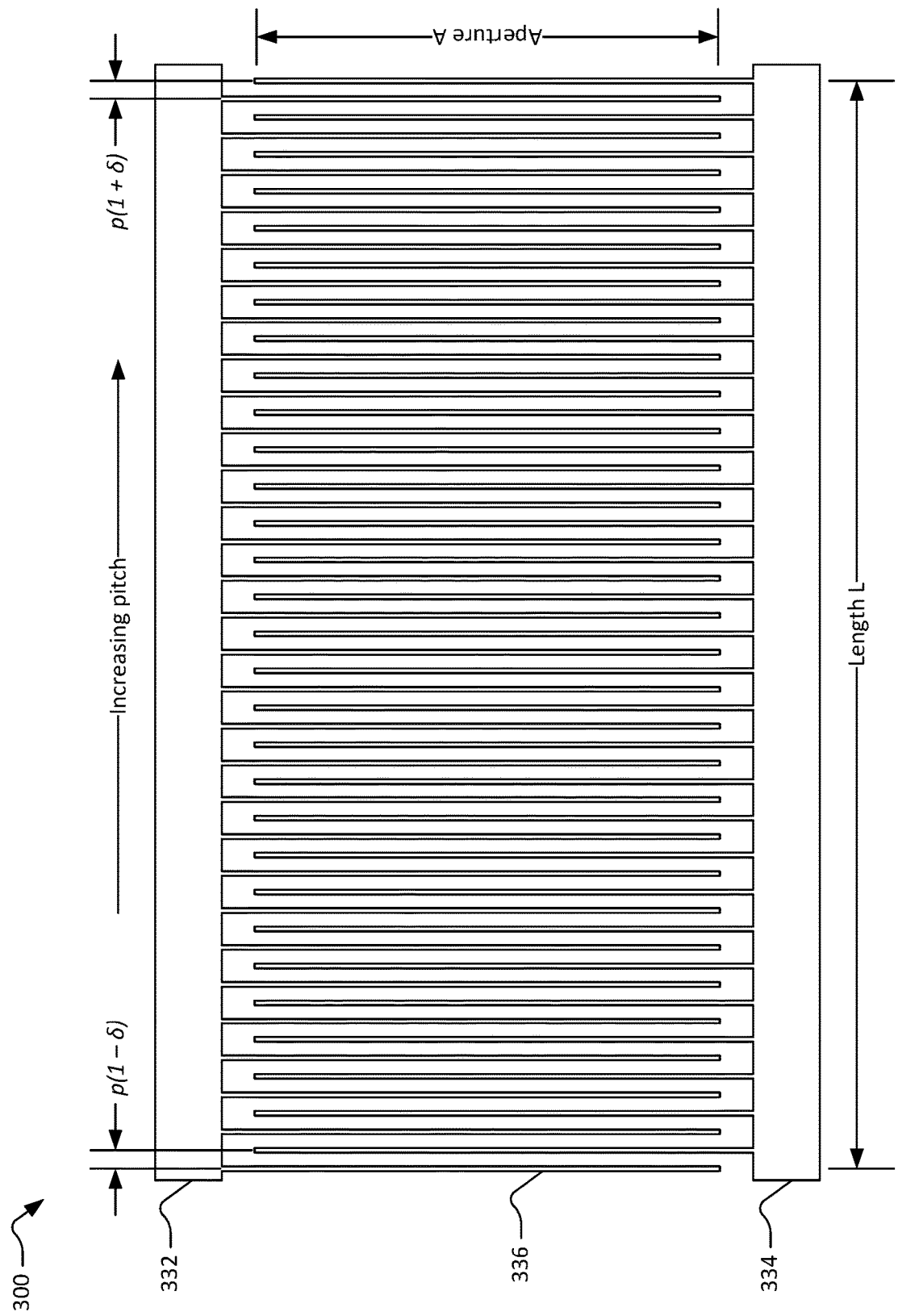
FIG. 3 is a plan view of another multi-pitch IDT.

FIG. 3 is a plan view of another multi-pitch IDT 300 with continuously varying pitch. The IDT 300 includes a first busbar 332, and second busbar 334, and a plurality of interleaved fingers such as finger 336. The interleaved fingers extend alternately from the first and second busbars 332, 334. The IDT 300 is not divided into sections, but rather has a continuous change in pitch along its length L. The IDT 300 has 60 fingers, which is exemplary. An IDT may have more than or fewer than 60 total fingers. The multi-pitch IDT 300 may be a portion of an XBAR such as the XBAR 100 of FIG. 1.

As shown in FIG. 3, the pitch at the left edge of the IDT 300 is $p(1-\delta)$, and the pitch at the right edge of the IDT 300 is $p(1+\delta)$. The pitch varies continuously between these two extremes. The variation in pitch may typically, but not necessarily, be a linear function of position along the length L of the IDT. $\delta$ is greater than 0, less than or equal to 0.05, and typically less than 0.01. $\delta$ may be selected during a filter design to achieve the most effective reduction of spurious modes. At any point along the length of the IDT 300, the pitch is constant across the aperture A. The mark, or width of the IDT fingers is constant over the entire IDT.

Figure 4:
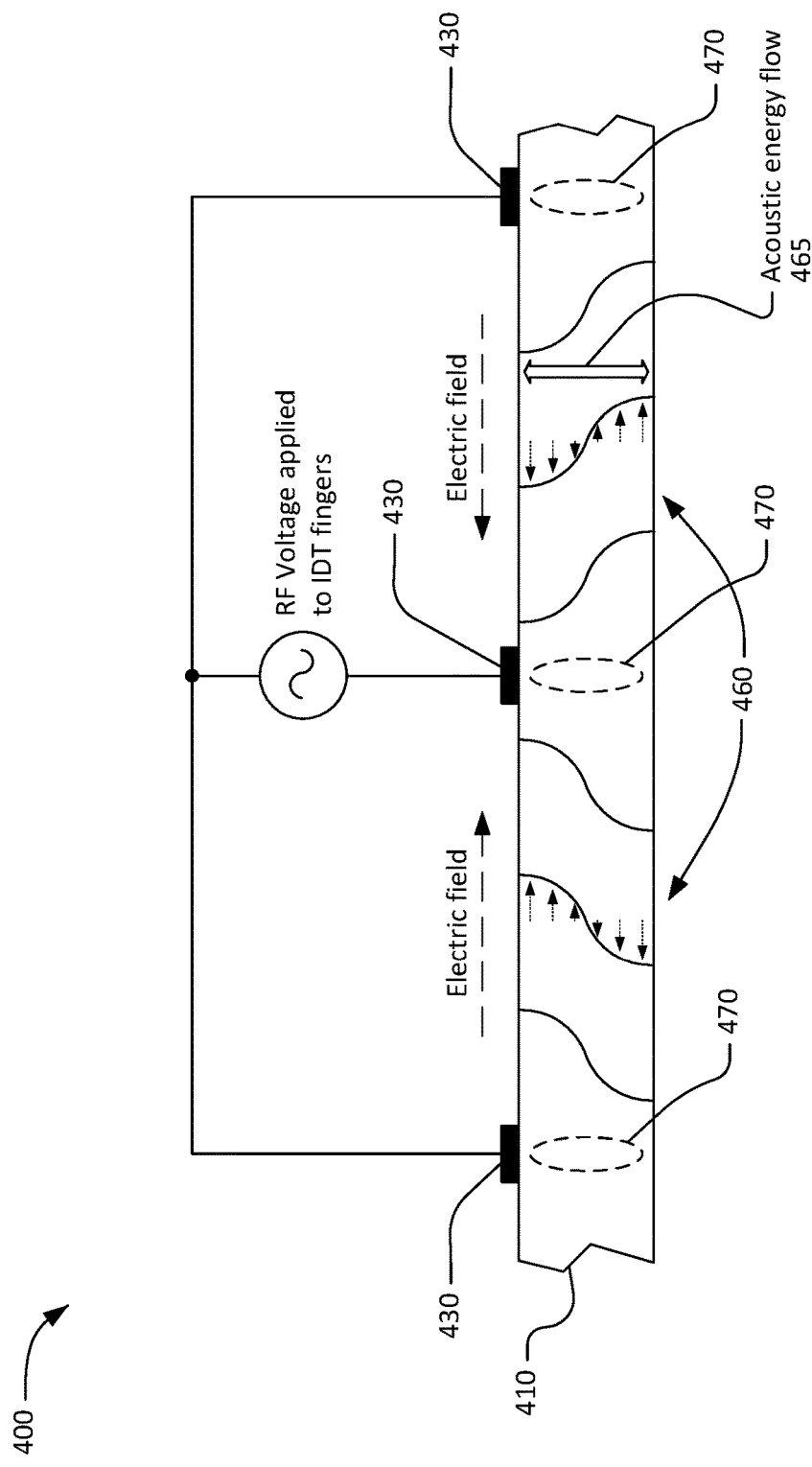
FIG. 4 is a graphic illustrating a shear horizontal acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430 which alternate in electrical polarity from finger to finger. An RF voltage is applied to the interleaved fingers 430. This voltage creates a time-varying electric field between the fingers. The direction of the electric field is predominantly lateral, or parallel to the surface of the piezoelectric plate 410, as indicated by the arrows labeled "electric field". Due to the high dielectric constant of the piezoelectric plate, the RF electric energy is highly concentrated inside the plate relative to the air. The lateral electric field introduces shear deformation which couples strongly to a shear primary acoustic mode (at a resonance frequency defined by the acoustic cavity formed by the volume between the two surfaces of the piezoelectric plate) in the piezoelectric plate 410. In this context, "shear deformation" is defined as deformation in which parallel planes in a material remain predominantly parallel and maintain constant separation while translating (within their respective planes) relative to each other. A "shear acoustic mode" is defined as an acoustic vibration mode in a medium that results in shear deformation of the medium. The shear deformations in the XBAR 400 are represented by the curves 460, with the adjacent small arrows providing a schematic indication of the direction and relative magnitude of atomic motion at the resonance frequency. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary acoustic mode is substantially orthogonal to the surface of the piezoelectric plate, as indicated by the arrow 465.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

Figure 5:
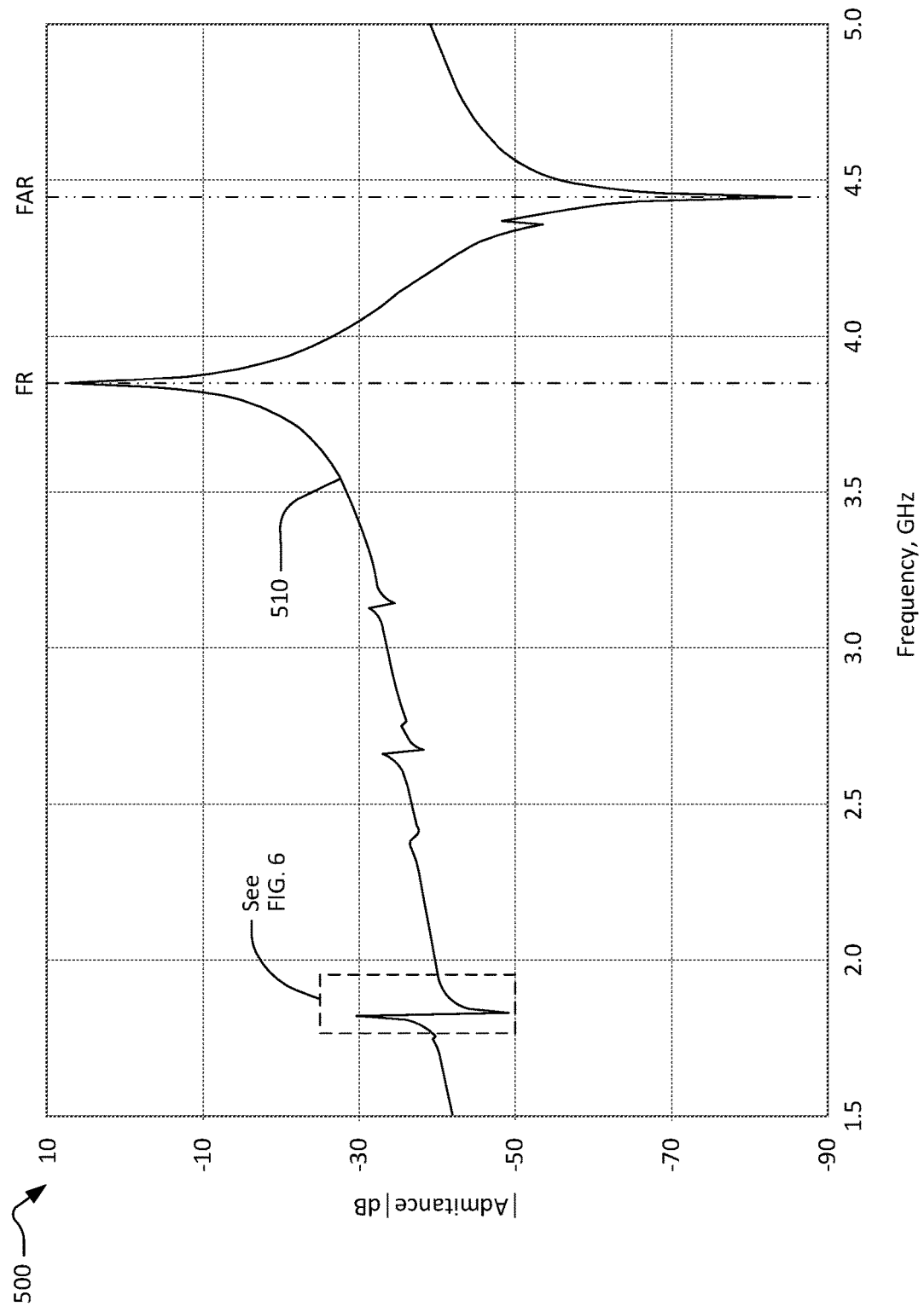
FIG. 5 is a graph of the magnitude of admittance versus frequency for an XBAR with a conventional interdigital transducer (IDT).

FIG. 5 is a graph 500 of the magnitude of admittance versus frequency for a first XBAR including a conventional (i.e. uniform pitch) IDT. The admittance was determined by simulation of the first XBAR using a finite element method. The line 510 is a plot of the magnitude of admittance. The shear primary acoustic mode of the first XBAR has an admittance maximum at a resonance frequency FR and an admittance minimum at an anti-resonance frequency FAR. The admittance plot 510 also exhibits multiple spurious modes or secondary resonances including a substantial spurious mode 515 at a frequency about 1.825 GHz.

At least some of the spurious modes found in XBARs are traveling plate waves. The frequencies of traveling plate wave modes may be proportional to IDT finger pitch. In contrast, the XBAR resonance and anti-resonance frequencies have only a slight dependence on IDT pitch. For example, changing IDT pitch from 7.5 times the piezoelectric plate thickness to 15 times (i.e. a 2:1 change) the piezoelectric plate thickness results in about 3% change in the resonance frequency of an XBAR.

Figure 6:
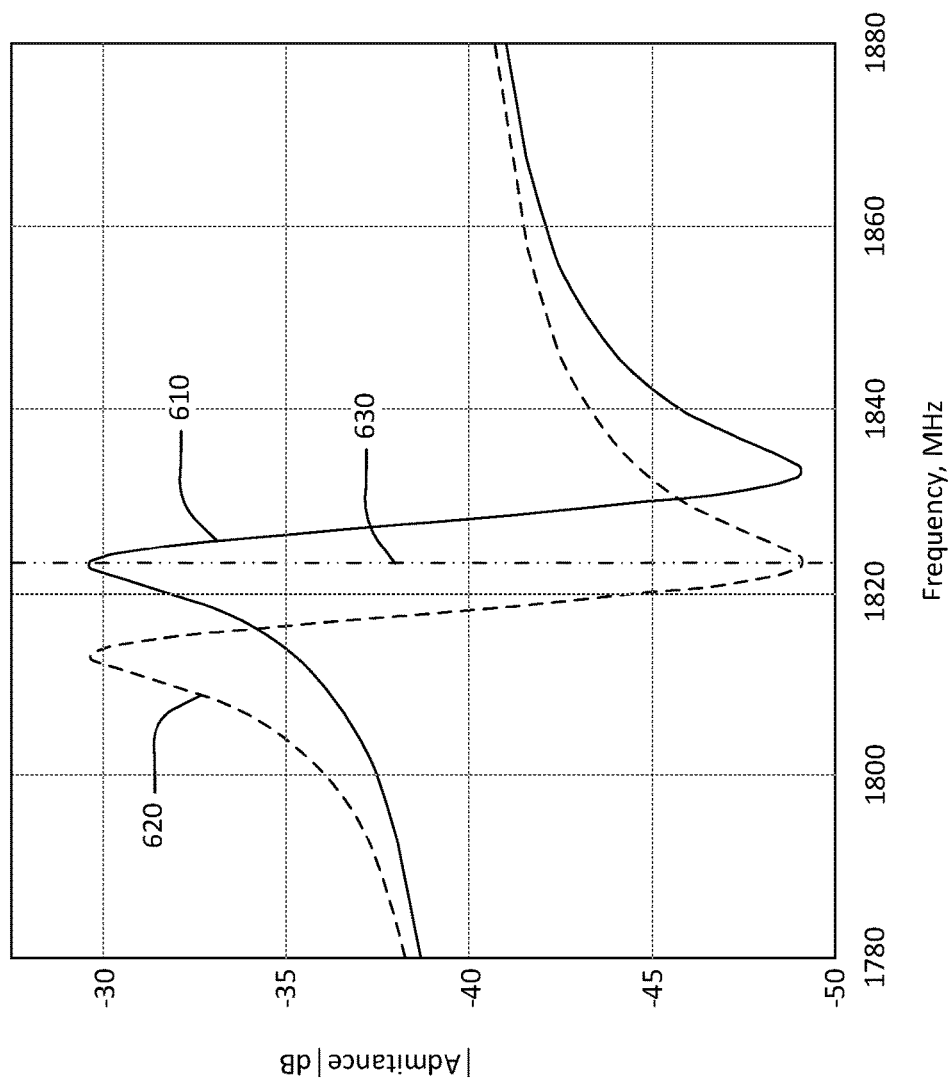
FIG. 6 is an expanded portion of the graph of FIG. 5.

Slight variations in the pitch of the IDT in an XBAR can result in disruption or destructive interference of spurious modes with negligible effect on the shear primary mode. This effect is illustrated in FIG. 6, which is an expanded view of a portion of the graph of FIG. 5 that contains the largest spurious mode. In FIG. 6, the solid curve 610 is a plot of the magnitude of admittance versus frequency for the XBAR with a conventional IDT, as previously shown in FIG. 5. The dashed curve 620 is a plot of the of the magnitude of admittance versus frequency of an XBAR with the IDT pitch increased by 0.5%. Increasing the IDT pitch by this amount lowers the frequency of the spurious mode by about 10 MHZ, such that the admittance maximum of the curve 610 is aligned with the admittance minimum of the curve 620, shown by dot-dot-dash line 630. If two resonators with these admittance characteristics were placed in parallel, the two spurious modes would, to at least some extent, cancel each other. Increasing the IDT pitch by 0.5% has a negligible effect on the resonance and anti-resonance frequencies of the shear primary acoustic mode of the XBAR.

Figure 7:
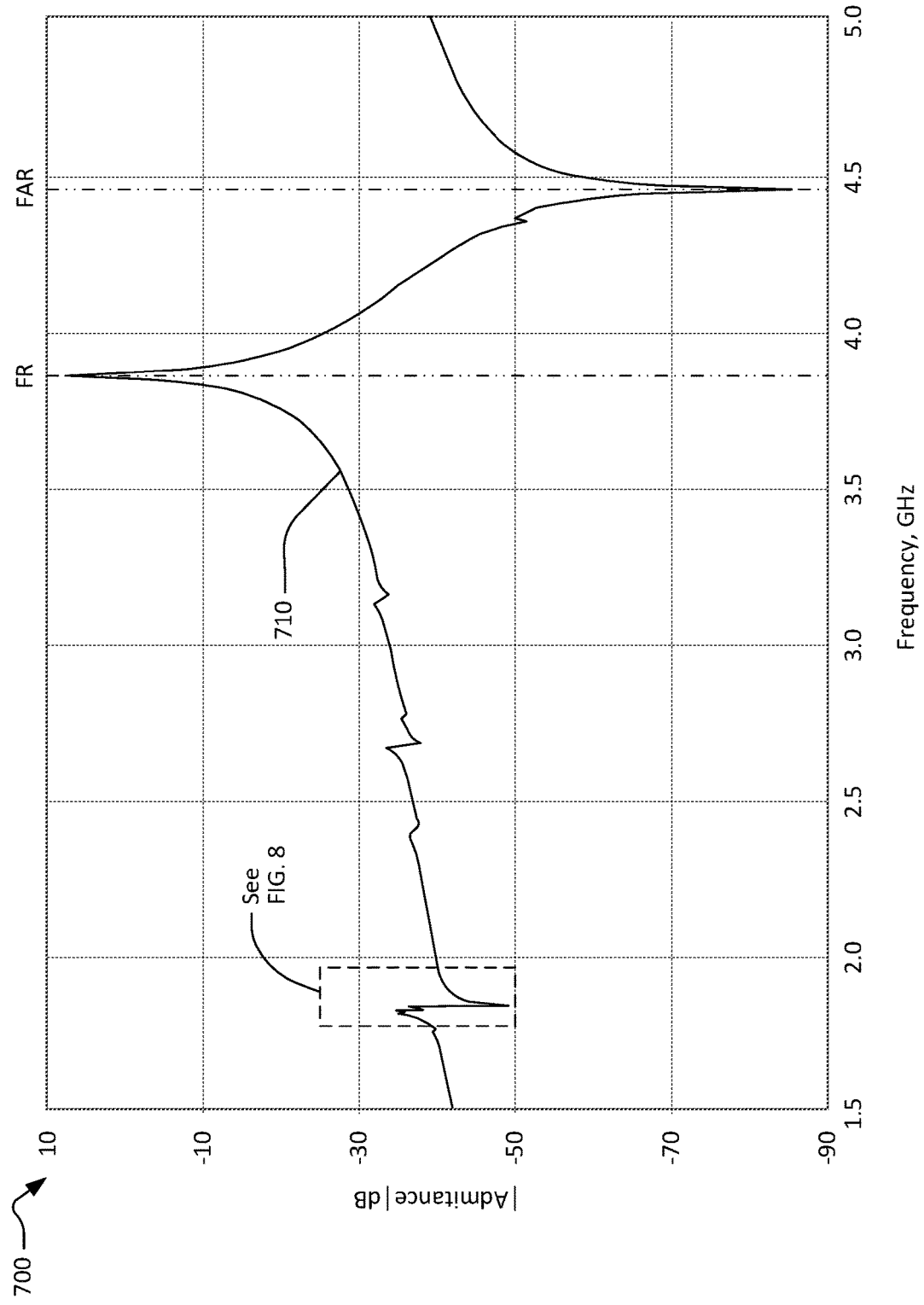
FIG. 7 is a graph of the magnitude of admittance versus frequency for an XBAR with a multi-pitch IDT.

FIG. 7 is a graph 700 of the magnitude of admittance versus frequency for a second XBAR including an IDT with varying pitch similar to the IDT 200 of FIG. 2. The IDT is divided along its length into three sections. The pitches of the three sections are 3.589, 3.6, and 3.611 microns (δ=0.003). Other than the IDT pitch, the second XBAR is identical to the first XBAR having admittance characteristic previously shown in FIG. 5. The admittance was determined by simulation of the second XBAR using a finite element method. The line 710 is a plot of the magnitude of admittance of the second XBAR. The shear primary acoustic mode of the second XBAR has an admittance maximum at a resonance frequency FR and an admittance minimum at an anti-resonance frequency FAR. The resonance and anti-resonance frequencies are the same as those the XBAR with a uniform-pitch IDT. The admittance plot 710 also exhibits multiple spurious modes or secondary resonances. Comparison of FIG. 5 and FIG. 7 shows that the amplitudes of all of the spurious modes are reduced in the second XBAR due to the use of an IDT with varying pitch.

Figure 8:
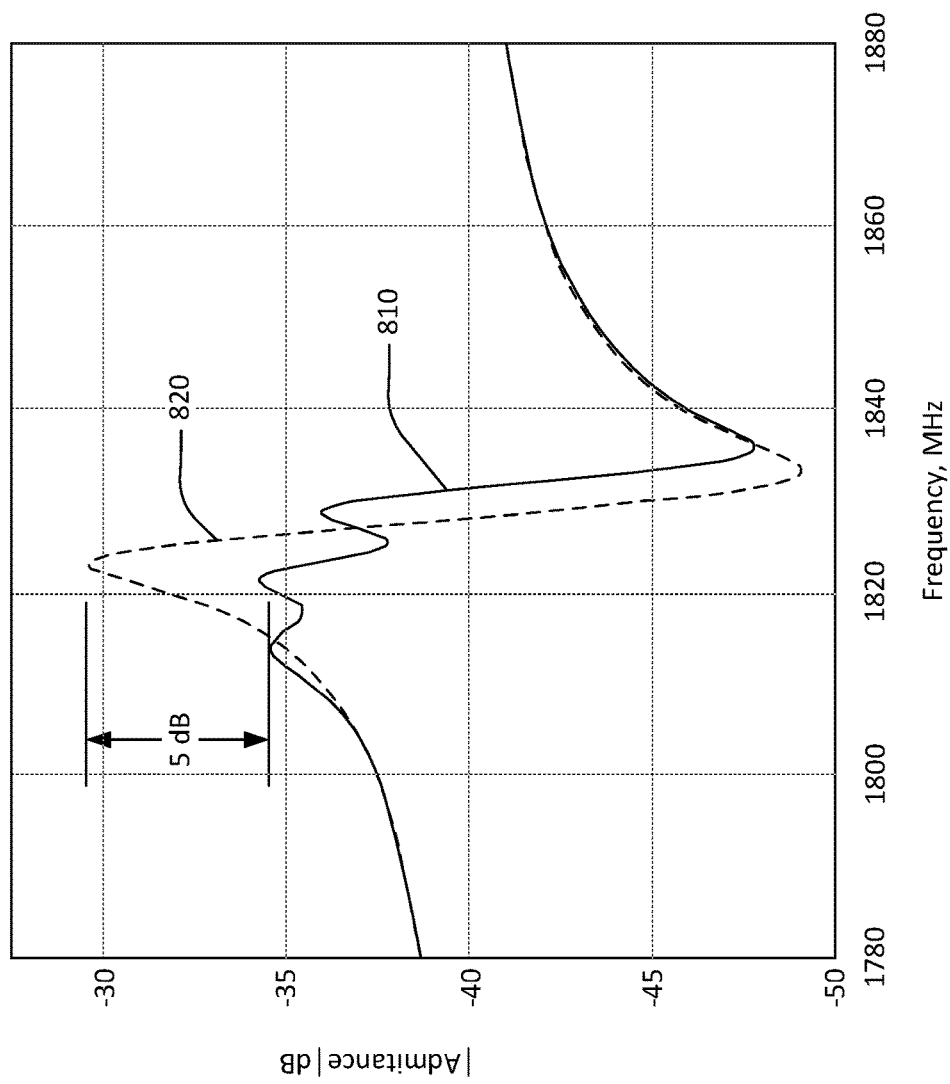
FIG. 8 is an expanded portion of the graph of FIG. 7.

FIG. 8 shows an expanded portion of the graph of FIG. 7 that contains the largest spurious mode. In FIG. 8, the solid curve 810 is a plot of the magnitude of admittance versus frequency for the XBAR including an IDT with varying pitch as shown in FIG. 2. The dashed curve 820 is a plot of the of the magnitude of admittance versus frequency of an XBAR with a conventional uniform-pitch IDT, as previously shown in FIG. 6. The incorporation of a multi-pitch IDT reduces the peak of the spurious mode by almost 5 dB.

Figure 9:
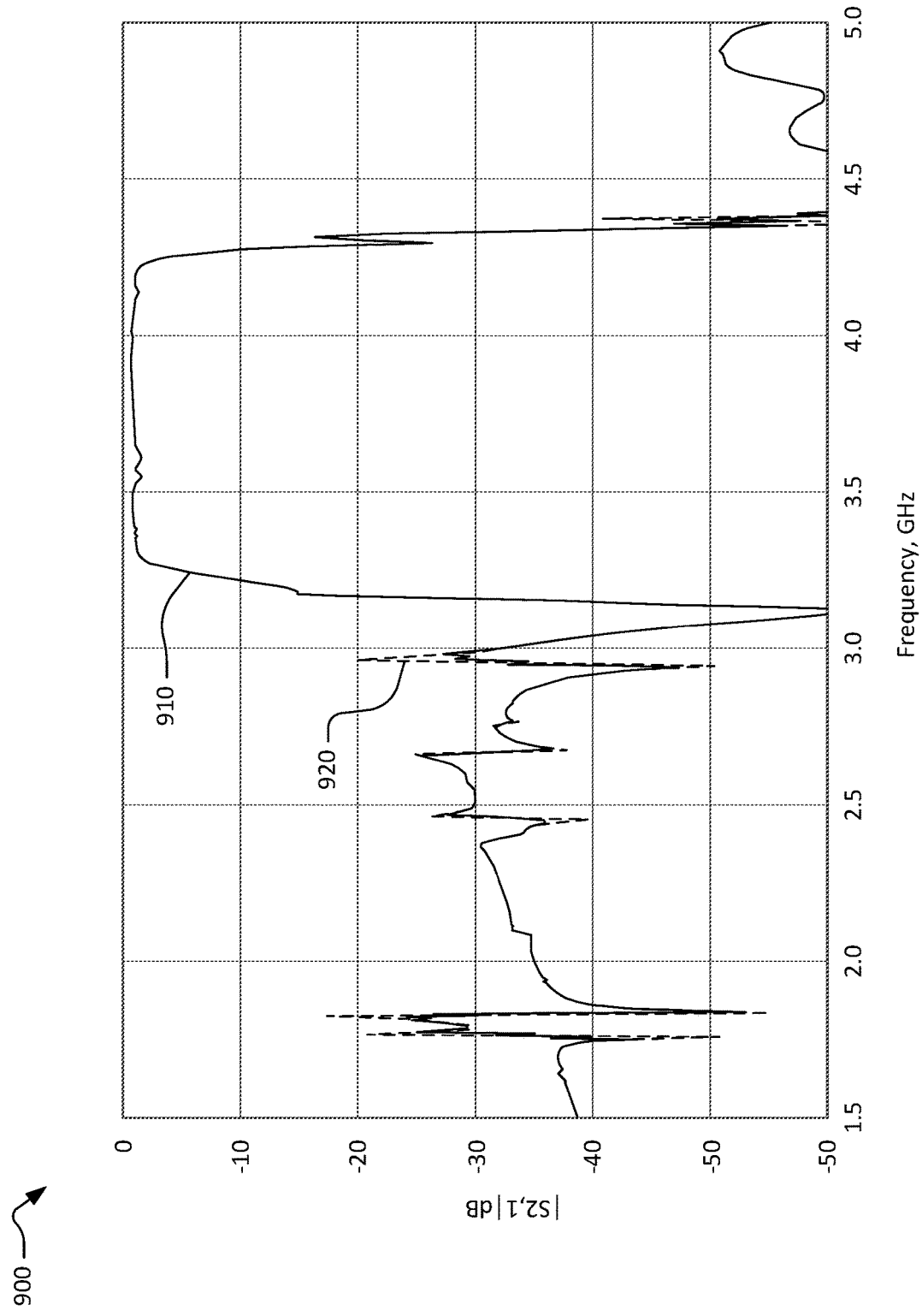
FIG. 9 is a graph of the input-output transfer function (S2,1) of a bandpass filter implemented using XBARs with multi-pitch IDTs.

FIG. 9 is a graph of the magnitude of S2,1, the input/output transfer function, for two bandpass filters implemented with XBAR devices. The S2,1 data was determined by simulation of the two filters using a finite element method. The solid curve 910 is a plot of S2,1 for a first filter using XBARs with multi-pitch IDTs. The first filter uses a ladder circuit with four series and four shunt resonators. Each resonator includes an IDT divided along its length into three equal sections as shown in FIG. 2. The parameter δ is 0.003 for series resonators and 0.004 for shunt resonators.

The dashed curve 920 is a plot of S2,1 for a second bandpass filter that has uniform-pitch IDTs but is otherwise identical the first bandpass filter. Comparison of the curves 910 and 920 shows the passbands of the two filters are effectively the same. Compared to the second filter, the first filter with of multi-pitch IDTs exhibits reduced peak admittance of spurious modes by as much as 8 dB.

The filters used to generate the data shown in FIG. 9 are exemplary. A filter may have less than or more than five resonators, and more or less than three series resonator and two shunt resonators. Multi-pitch IDTs may be divided into two sections or more than three sections, or may be continuous. The number of sections may not be the same for all resonators in a filter, and a filter may include both sectioned and continuous multi-pitch IDTs. The value of δ may be different for some or all of the resonators. A filter may contain a combination of resonators with uniform pitch and multi-pitch resonators.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A filter device comprising:
a plurality of bulk acoustic wave resonators that each comprise:
a piezoelectric layer having front and back surfaces, the back surface attached to a surface of a substrate either directly or via one or more intermediate layers, the piezoelectric layer having a portion that forms a diaphragm over a cavity of the bulk acoustic wave resonator; and
a conductor pattern on the piezoelectric layer and comprising an interdigital transducer (IDT) having interleaved fingers on the diaphragm,
wherein each IDT of all of the plurality of bulk acoustic wave resonators is a multi-pitch IDT, wherein pitch is a center-to-center spacing between any adjacent interleaved fingers extending from opposing busbars of the respective IDT,
wherein each of a first IDT of a first bulk acoustic wave resonator of the plurality of bulk acoustic wave resonators and a second IDT of a second bulk acoustic wave resonator of the plurality of bulk acoustic wave resonators is divided along a length of the respective IDT into at least three sections, with each of a first section, a second section, and a third section of the first IDT and the second IDT having multiple pairs of interleaved fingers, wherein the multiple pairs of interleaved fingers from each section each have a pitch that is different from respective pitches of the other sections of the at least three sections,
wherein the first, second and third sections of each of the first IDT and the second IDT have essentially an equal number of interleaved fingers as each other, and a mark of the interleaved fingers in each of the first, second and third sections is constant in each section and across each of the first, second and third sections,
wherein the respective pitch of the multiple pairs of interleaved fingers in each of the first, second and third sections is constant,
wherein the filter device is a ladder circuit with the first IDT forming a series resonator of the ladder circuit and the second IDT forming a shunt resonator of the ladder circuit, and
wherein a change in the pitch between the at least three sections of each of the plurality of bulk acoustic wave resonators has a smaller effect on a primary shear acoustic mode of all of the at least three sections of each bulk acoustic wave resonator in comparison to an effect that the change in pitch has on a spurious acoustic mode other than the primary shear acoustic mode of all of the at least three sections of each of the first IDT and the second IDT.

2. The filter device of claim 1, wherein the piezoelectric layer and IDTs of the plurality of bulk acoustic wave resonators are configured such that a radio frequency signal applied to each IDT excites the primary shear acoustic mode in the diaphragm, the primary shear acoustic mode being a bulk shear mode where acoustic energy propagates along a direction substantially orthogonal to the front and back surfaces of the piezoelectric layer that is lateral to a direction of an electric field generated by the IDT, and wherein atomic motions excited by the electric field are predominantly parallel to the front and back surfaces of the respective piezoelectric layer.

3. The filter device of claim 1, wherein a number of the at least three sections of the first IDT is different than a number of the at least three sections of the second IDT.

4. The filter device of claim 1, wherein, for at least one of the first IDT and the second IDT, a variance in the pitch of the at least three sections is between 7.5 times a thickness of the piezoelectric layer and 15 times a thickness of the piezoelectric layer.

5. The filter device of claim 1, wherein the respective IDTs of the plurality of bulk acoustic wave resonators are configured to have admittance characteristics such that the spurious acoustic mode would at least partially be canceled out if the first bulk acoustic wave resonator were placed in parallel with the second bulk acoustic wave resonator.

6. The filter device of claim 1, wherein the first, second and third sections of each of the first IDT and the second IDT have essentially an equal number of interleaved fingers as each other.

7. The filter device of claim 1, wherein a mark of each of the interleaved fingers is a width of each of the interleaved fingers within each of the first, second, and third sections of each of the first IDT and the second IDT, respectively, and wherein the mark of the interleaved fingers in each of the first, second and third sections of the second IDT is constant in each section and across each of the first, second and third sections.

8. The filter device of claim 1, wherein, for each of the first IDT and the second IDT, the second section is between the first and third sections along the length of the IDT, and a pitch of the first section is $p(1+\delta)$, a pitch of the second section is $p$, and a pitch of the third section is $p(1-\delta)$, and $\delta$ of the second IDT of the shunt resonator is greater than $\delta$ of the first IDT of the series resonator.

9. The filter device of claim 1, wherein the smaller effect is a smaller change in primary shear acoustic mode amplitude than a change in spurious acoustic mode amplitude.

10. A filter device comprising:
a plurality of bulk acoustic wave resonators that each comprise:
a piezoelectric layer having front and back surfaces, the back surface attached to a surface of a substrate either directly or via one or more intermediate layers, the piezoelectric layer having a portion that forms a diaphragm over a cavity of the bulk acoustic wave resonator; and
a conductor pattern on the piezoelectric layer and comprising an interdigital transducer (IDT) having interleaved fingers on the diaphragm, wherein the interleaved fingers extend from opposing busbars,
wherein a first IDT of a first bulk acoustic wave resonator of the plurality of bulk acoustic wave resonators is a multi-pitch IDT that is divided along a length of the multi-pitch IDT into at least three sections, with each of a first section, a second section and a third section of the first IDT having at least one pair of interleaved fingers that each has a pitch that has a variation from respective pitches of the other sections, and wherein pitch is center-to-center spacing between the at least one pair of interleaved fingers, wherein the at least one pair interleaved fingers are adjacent interleaved fingers extending from opposing busbars of the first IDT,
wherein a second IDT of a second bulk acoustic wave resonator of the plurality of bulk acoustic wave resonators is a multi-pitch IDT that is divided along a length of the multi-pitch IDT into at least three sections, with each of a first section, a second section and a third section of the second IDT having at least one pair of interleaved fingers that each has a pitch that has a variation from respective pitches of the other sections, and wherein pitch is center-to-center spacing between the at least one pair of interleaved fingers, wherein the at least one pair interleaved fingers are adjacent interleaved fingers extending from opposing busbars of the second IDT, wherein the filter device is a ladder circuit with the first IDT forming a series resonator of the ladder circuit and the second IDT forming a shunt resonator of the ladder circuit, wherein the respective pitch in each of the first, second and third sections of each of the first IDT and the second IDT is constant, and wherein the variation of the pitch between the at least three sections of each of the plurality of bulk acoustic wave resonators has a smaller effect on a primary shear acoustic mode of each respective bulk acoustic wave resonator in comparison to an effect that the variation of pitch has on a spurious acoustic mode in the filter device other than the primary shear acoustic mode.

11. The filter device of claim 10, wherein:
for each of the first IDT and the second IDT, the second section is between the first and third sections along the length of the IDT, and a pitch of the first section is $p(1+\delta)$, a pitch of the second section is p, and a pitch of the third section is $p(1-\delta)$, where p is a nominal pitch, and $\delta$ of the second IDT forming the shunt resonator is greater than $\delta$ of the first IDT forming the series resonator.

12. The filter device of claim 10, wherein, for at least one of the first IDT and the second IDT, the variation in the pitch of the at least three sections is between 7.5 times a thickness of the piezoelectric layer and 15 times a thickness of the piezoelectric layer.

13. The filter device of claim 10, wherein:
the piezoelectric layer and the IDTs of the plurality of bulk acoustic wave resonators are configured such that a radio frequency signal applied to each IDT excites the primary shear acoustic mode in the diaphragm, the primary shear acoustic mode being a bulk shear mode where acoustic energy propagates along a direction substantially orthogonal to the front and back surfaces of the piezoelectric layer that is lateral to a direction of electric field generated by the IDT, and for each of the plurality of bulk acoustic wave resonators, the primary shear acoustic mode is excited by the electric field such that atomic motions are predominantly parallel to the front and back surfaces of the piezoelectric layer to introduce shear deformation within the piezoelectric layer.

14. The filter device of claim 13, wherein the variation of the pitch of the second IDT is greater than the variation of the pitch of the first IDT.

15. A filter device comprising:
a plurality of bulk acoustic wave resonators that each comprise:
a piezoelectric layer; and
a conductor pattern on the piezoelectric layer and comprising an interdigital transducer (IDT) having interleaved fingers, wherein each of a first IDT of a first bulk acoustic wave resonator of the plurality of bulk acoustic wave resonators and a second IDT of a second bulk acoustic wave resonator of the plurality of bulk acoustic wave resonators is divided along a length of the respective IDT into at least three sections, with each of a first section, a second section, and third section of the first IDT and the second IDT having multiple interleaved fingers, wherein the multiple interleaved fingers from each section each have a center-to-center distance between adjacent interleaved fingers of the multiple interleaved fingers that is different from respective center-to-center distances between adjacent interleaved fingers of the multiple interleaved fingers of the other sections, wherein the respective center-to-center distance between adjacent interleaved fingers of the multiple interleaved fingers in each of the first, second and third sections of each of the first IDT and second IDT is constant, and wherein a change in the center-to-center distance between adjacent interleaved fingers between the at least three sections of each of the plurality of bulk acoustic wave resonators is configured to reduce an amplitude of a spurious acoustic mode of all of the at least three sections more than a reduction in amplitude of a primary shear acoustic mode of all of the at least three sections of each respective bulk acoustic wave resonator.

16. The filter device of claim 15, wherein:
the piezoelectric layer of each of the plurality of bulk acoustic wave resonators has front and back surfaces, the back surface attached to a surface of a substrate either directly or via one or more intermediate layers, the piezoelectric layer of each of the plurality of bulk acoustic wave resonators has a portion that forms a diaphragm over a cavity of the bulk acoustic wave resonator, and the interleaved fingers of the IDT of each of the plurality of bulk acoustic wave resonators is on the diaphragm.

17. The filter device of claim 15, wherein the first, second and third sections of each of the first IDT and the second IDT have essentially an equal number of interleaved fingers as each other.

18. The filter device of claim 15, wherein a mark of the interleaved fingers in each of the first, second and third sections is constant in each section and across each of the first, second and third sections.

19. The filter device of claim 15, wherein the piezoelectric layer and the IDTs of each of the plurality of bulk acoustic wave resonators are configured such that a radio frequency signal applied to each IDT excites the primary shear acoustic mode in the piezoelectric layer, the primary shear acoustic mode being a bulk shear mode where acoustic energy propagates along a direction substantially orthogonal to a surface of the piezoelectric layer that is lateral to a direction of electric field generated by the IDT.

20. The filter device of claim 15, wherein the spurious acoustic mode is between a resonance frequency and an antiresonance frequency of the primary shear acoustic mode.

* * * * *